United States Patent [19]
Kohiyama

[11] Patent Number: 5,621,741
[45] Date of Patent: Apr. 15, 1997

[54] METHOD AND APPARATUS FOR TESTING TERMINAL CONNECTIONS OF SEMICONDUCTOR INTEGRATED CIRCUITS

[75] Inventor: Kiyoshi Kohiyama, Kawasaki, Japan

[73] Assignee: Fujitsu Limited, Kawasaki, Japan

[21] Appl. No.: 115,138

[22] Filed: Sep. 1, 1993

[30]     Foreign Application Priority Data

Mar. 1, 1993   [JP]   Japan .................................. 5-040032

[51] Int. Cl.$^6$ .................................................. G01R 31/28
[52] U.S. Cl. ........................... 371/27; 371/22.1; 371/22.3
[58] Field of Search ........................... 371/27, 22.4, 22.6, 371/25.1, 22.1, 22.3; 324/73.1

[56]              References Cited

U.S. PATENT DOCUMENTS

| | | | |
|---|---|---|---|
| 4,058,767 | 11/1977 | Muehldorf et al. | 324/73 R |
| 4,509,008 | 4/1985 | DasGupta et al. | 324/73 R |
| 4,864,579 | 9/1989 | Kishida et al. | 371/22.3 |
| 4,910,735 | 3/1990 | Yamashita | 371/22.4 |
| 5,012,185 | 4/1991 | Ohfuji | 324/158 |
| 5,070,296 | 12/1991 | Priebe | 324/73.1 |
| 5,107,207 | 4/1992 | Noyori | 324/158 |
| 5,127,008 | 6/1992 | Bassett et al. | 371/22.3 |
| 5,150,047 | 9/1992 | Saito et al. | 324/158 |
| 5,216,672 | 6/1993 | Tatosian | 371/21.1 |
| 5,228,139 | 7/1993 | Miwa et al. | 395/575 |
| 5,315,242 | 5/1994 | Enami | 324/158 |
| 5,384,533 | 1/1995 | Tokuda et al. | 324/158.1 |
| 5,390,191 | 2/1995 | Shiono et al. | 371/22.3 |

*Primary Examiner*—Emanuel T. Voeltz
*Assistant Examiner*—Patrick J. Assouad
*Attorney, Agent, or Firm*—Staas & Halsey

[57]              ABSTRACT

A method tests connections between terminal of a first semiconductor integrated circuit and terminals of a second semiconductor integrated circuit. These first and second semiconductor integrated circuits are mounted on a printed circuit board. The first semiconductor integrated circuit has a test data generator for generating test data for the terminal connection test, a selector for selecting outputs of the test data generator during the terminal connection test, and a test data output unit for providing the test data from the selector to the outside. The second semiconductor integrated circuit has a test data fetch-hold unit for fetching and holding the test data provided by the first semiconductor integrated circuit. This method is characterized by verifying whether or not an output of the test data fetch-hold unit represents a predetermined value, to thereby test the terminal connections of the first and second semiconductor integrated circuits and the AC characteristics thereof.

14 Claims, 7 Drawing Sheets

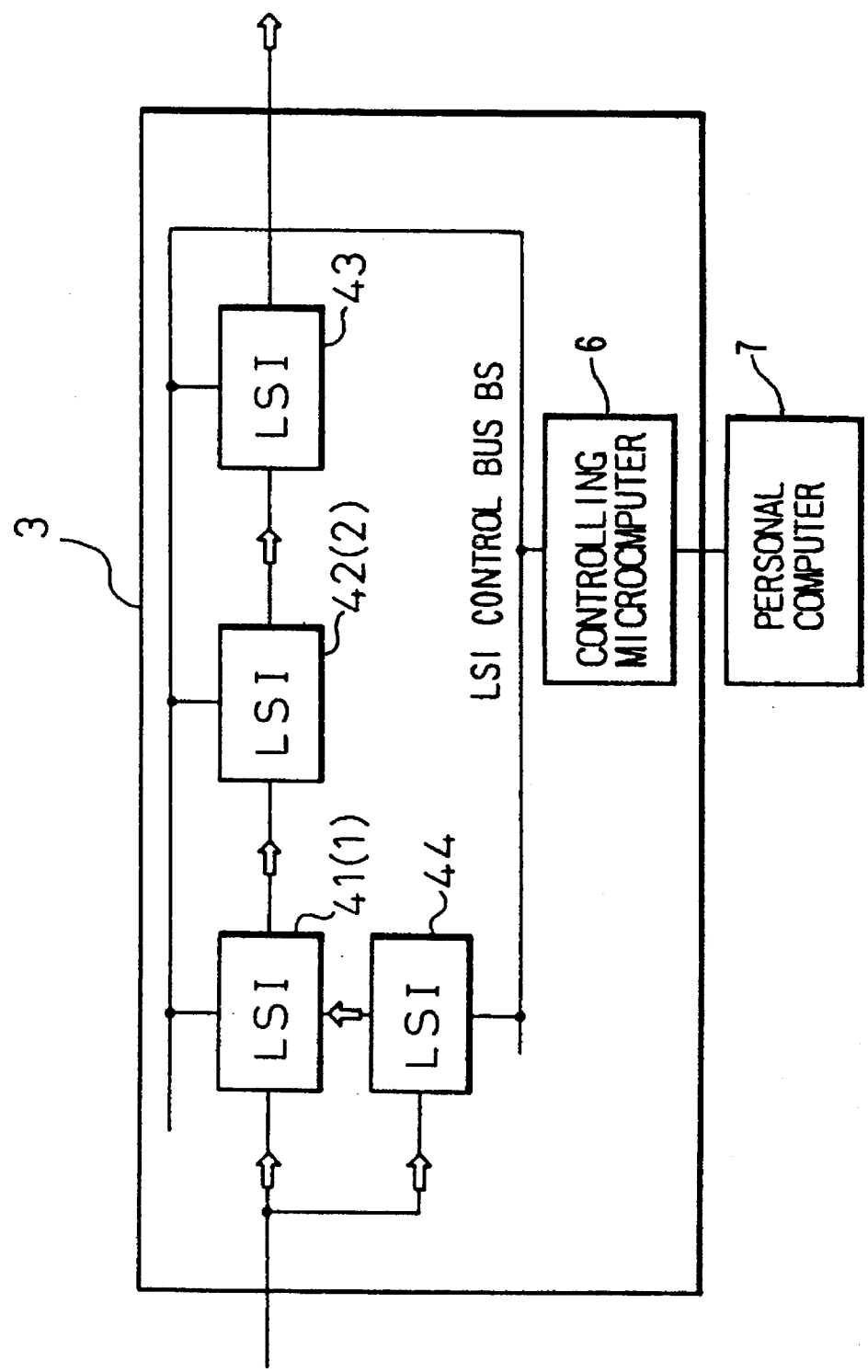

METHOD AND APPARATUS FOR TESTING TERMINAL CONNECTIONS OF SEMICONDUCTOR INTEGRATED CIRCUITS

BACKGROUND OF THE INVENTION

1. Field of the Invention

The present invention relates to a method and an apparatus for testing connections between terminals of semiconductor ICs (integrated circuits) and, more particularly, to a method and apparatus for testing connections between terminals of a plurality of semiconductor ICs mounted on a printed circuit board.

2. Description of the Related Art

Recent large scale integration (LSI) circuits have many terminals as well as connections that are formed between the terminals. As the number of terminal connections of LSI circuits increases, it becomes more difficult to test whether or not the LSI circuits are actually connected to one another through the terminals.

In television digital signal processing LSI circuits such as high-vision MUSE decoders, images will not be greatly affected if the lower one or two bits among, for example, 10-bit digital image data are incorrectly connected between terminals of the LSI circuits. In this case, a visual inspection of the displayed image is ineffective in checking for incorrect connections.

One method of testing connections between terminals of LSI circuits employs a board tester that supplies external test signals to a printed circuit board on which the LSI circuits to be tested are mounted. The test signals drive the LSI circuits, which provide resultant outputs. The resultant outputs are compared with reference values by a pattern comparator of the board tester, to thereby test the terminal connections of the LSI circuits.

Another test method arranges a test circuit inside an LSI circuit to be tested. The test circuit steadily provides a signal of a logic level, either HIGH or LOW, during a test period. The method determines whether or not connections of terminals of the LSI circuit are correct, depending on whether r not the LSI circuit correctly receives the signal.

According to the method of employing the board tester, a printed circuit board to be tested must have, in addition to original circuits, various test-related circuits such as a circuit for supplying test signals to the LSI circuits and a circuit for supplying output signals of the LSI circuits to the board tester that is external to the printed circuit board. These test-related circuits may deteriorate connection conditions, such as load capacitance between the terminals of LSI circuits, thus causing problems in high-speed digital signal processing circuits in particular.

The method of arranging a test circuit in an LSI circuit and steadily supplying a signal of a HIGH or a LOW level from the test circuit to the LSI circuit during a test period is incapable of testing high and low levels for a normal operation as well as dynamically changing AC characteristics.

SUMMARY OF THE INVENTION

An object of the present invention is to provide a method of testing connections between terminals of semiconductor ICs, capable of simply testing the AC characteristics of the ICs.

According to the present invention, there is provided a method of testing connections between terminals of a first semiconductor integrated circuit and terminals of a second semiconductor integrated circuit, wherein the first and second semiconductor integrated circuits are mounted on a printed circuit board; the first semiconductor integrated circuit comprises a test data generation unit for generating test data for the terminal connection test, a selection unit for selecting outputs of the test data generation unit during the terminal connection test, and a test data output unit for providing the test data from the selection unit to an output connection; the second semiconductor integrated circuit comprises a test data fetch-hold unit for fetching and holding the test data provided by the first semiconductor integrated circuit; and the terminal connections of the first and second semiconductor integrated circuits are tested by verifying whether or not an output of the test data fetch-hold unit represents a predetermined value.

Further, according to the present invention, there is also provided an apparatus for testing connections between terminals of a first semiconductor integrated circuit and terminals of a second semiconductor integrated circuit, wherein the apparatus comprises the first and second semiconductor integrated circuits mounted on a printed circuit board; the first semiconductor integrated circuit including a test data generation unit for generating test data for the terminal connection test, a selection unit for selecting outputs of the test data generation unit during the terminal connection test, and a test data output unit for providing the test data from the selection unit to an output connection; the second semiconductor integrated circuit including a test data fetch-hold unit for fetching and holding the test data provided by the first semiconductor integrated circuit; and the terminal connections of the first and second semiconductor integrated circuits being tested by verifying whether or not an output of the test data fetch-hold unit represents a predetermined value.

The first semiconductor integrated circuit may further comprises a load signal output unit for providing a load signal when carrying out the terminal connection test, and the test data fetch-hold unit of the second semiconductor integrated circuit may be a load signal receiving register that fetches the test data in response to the load signal. The method or apparatus may further comprises arrangement for optionally assigning a terminal of the first semiconductor integrated circuit as a load signal providing terminal, and a terminal of the second semiconductor integrated circuit as a load signal receiving terminal, to make connections between the load signal terminals testable.

The load signal may be determined to be a second clock of a clock signal, and the test data to be fetched by the load signal receiving register may be inverted between a first clock and the second clock of the clock signal, so that a set-up time of AC characterisitics may be tested. Similarly, the load signal may be determined to be a second clock of a clock signal, and the test data to be fetched by the load signal receiving register may be inverted between the second clock and a third clock of the clock signal, so that a set-up time of AC characteristics may be tested.

The first and second semiconductor integrated circuits may include load signal generation unit each for generating a load signal in response to a test mode signal, and the test data fetch-hold unit of the second semiconductor integrated circuit may be a load signal receiving register that fetches the test data in response to the load signal. The load signal generation unit of each of the first and second semiconductor integrated circuits may include a rise detector for detecting a rise of the test mode signal and a counter for providing the load signal a predetermined time after the rise detector detects the rise of the test mode signal.

BRIEF DESCRIPTION OF THE DRAWINGS

The present invention will be more clearly understood from the description of the preferred embodiments as set forth below with reference to the accompanying drawings, wherein:

FIG. 8 explains a method of testing connections between terminals of semiconductor ICs mounted on a printed circuit board, according to the present invention.

DESCRIPTION OF THE PREFERRED EMBODIMENTS

Methods of testing connections between terminals of semiconductor ICs according to preferred embodiments of the present invention will be explained with reference to the drawings.

Figure 1:
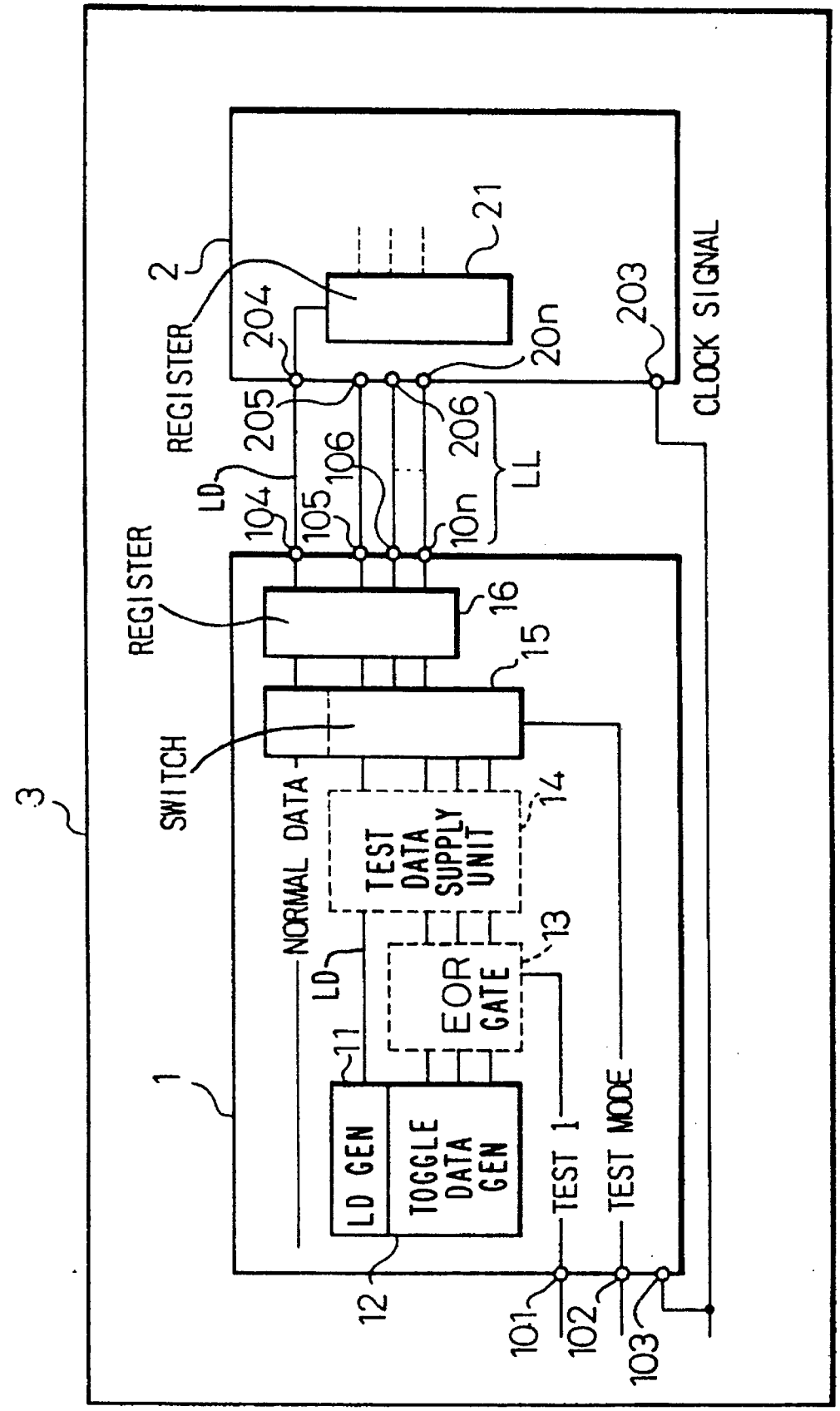
FIG. 1 shows testing of connections between terminals of semiconductor ICs (LSI circuits) according to a first embodiment of the present invention.

FIG. 1 shows first and second semiconductor LSI circuits 1 and 2 according to a first embodiment of the present invention and a method of testing connections between terminals of the LSI circuits. The first and second LSI circuits 1 and 2 are mounted on a printed circuit board 3. The AC characteristics, etc., of connections between terminals 105 to 10*n* of the first LSI circuit 1 and terminals 205 to 20*n* of the second LSI circuit 2 are dynamically tested.

Numeral 11 is a generator for generating a load signal LD, 12 is a toggle data generator, 13 is an EOR gate, 14 is a test data supplying unit, 15 is a switch, and 16 is a register.

To test connections between the LSI circuits 1 and 2, a test mode signal is supplied to a test mode terminal 102 so that the switch 15 changes data supplied to the register 16 from normal data to test data. The test data may be composed of toggle data provided by the toggle data generator 12 and the load signal LD provided by the load signal generator 11. The toggle data is repeatedly inverted between 1 and 0 each clock cycle. The test data is transferred to a register 21 of the second LSI circuit through the switch 15, register 16, the terminals 105 to 10*n* of the first LSI circuit 1, pattern wiring LL on the printed circuit board 3, and the terminals 205 to 20*n* of the second LSI circuit 2.

The register 21 receives the load signal LD over pattern wiring LL connected through the terminals 104 and 204. When the load signal LD changes to, for example, HIGH, the register 21 fetches the test data, i.e., the toggle data, through the terminals 105 to 10*n* and 205 to 20*n*. Connections between the terminals 105 to 10*n* of the first LSI circuit 1 and the terminals 205 to 20*n* of the second LSI circuit 2 are tested by reading the data out of the register 21 and by verifying whether or not the data represents a predetermined value.

To ensure the test, the data to be held in the register 21 may be inverted and again read for verification. Namely, when a signal TEST1 supplied to a test terminal 101 changes, the EOR gate 13 provides an EOR of the signal TEST1 and the toggle data, thereby inverting the toggle data. The inverted toggle data is supplied to the register 21. The test data need not be toggle data. For example, it may involve an instantaneous different bit of 0 or 1 such as "11011," or "00100."

Figure 2:
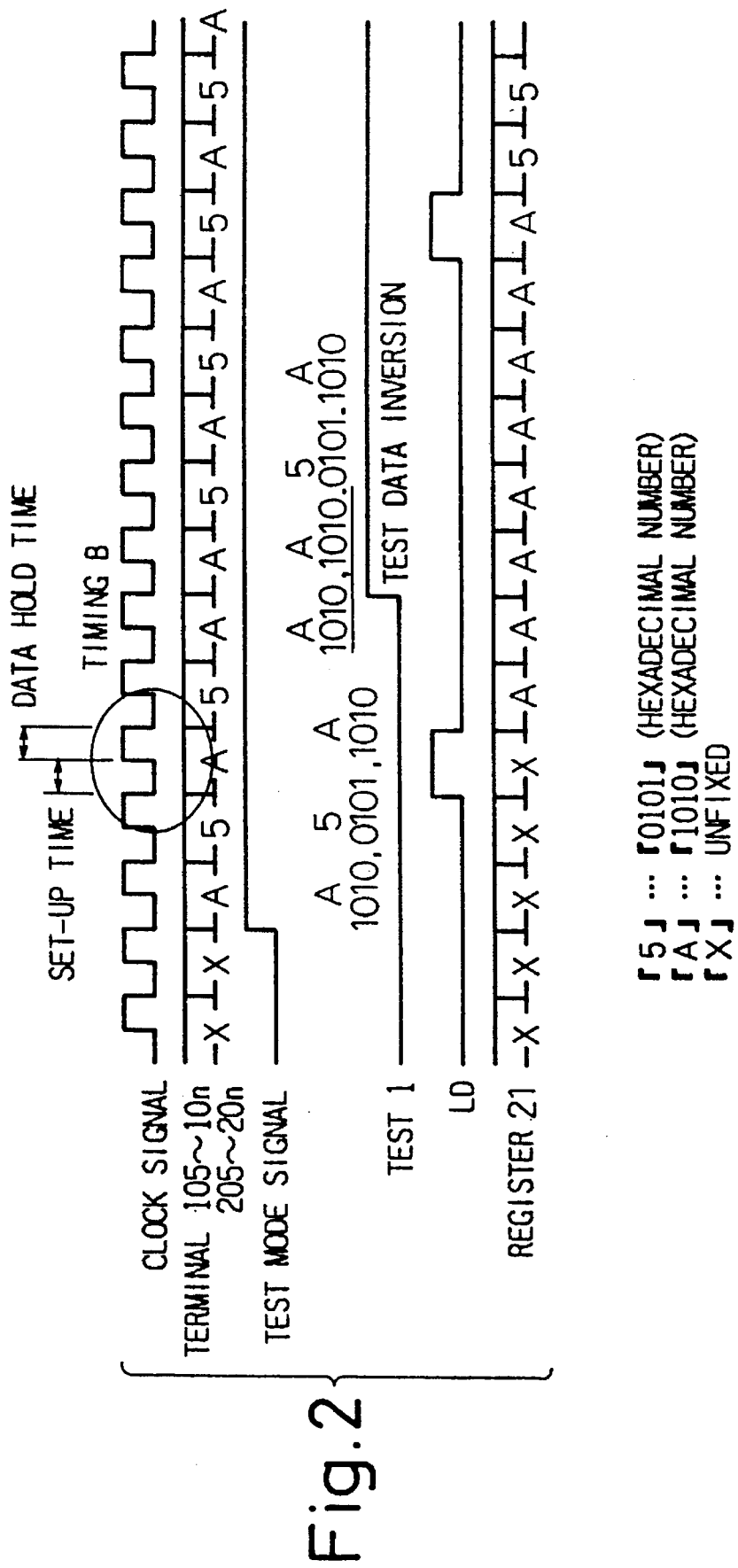
FIG. 2 is a timing chart explaining the testing of connections between the terminals of the semiconductor ICs of FIG. 1.

FIG. 2 is a timing chart explaining an example of testing of connections between the terminals of the semiconductor ICs of FIG. 1. In FIG. 2, a hexadecimal number 5 corresponds to data "0101," a hexadecimal number "A" corresponds to data "1010," and a mark "X" represents unfixed (e.g., random) data. The four bits of the data "5" are the inverse of the four bits of the data "A," and the logic levels of the successive, adjacent bits of each of the data "5" and "A" are different from each other.

When the test mode signal supplied to the test mode terminal 102 of the first LSI circuit 1 rises from level LOW to level HIGH, the switch 15 supplies the test data to the register 16. Accordingly, the test data that alternates between "A" and "5" is supplied to the register 21 through the terminals 105 to 10*n* of the first LSI circuit 1, the pattern wiring LL on the printed circuit board 3, and the terminals 205 to 20*n* of the second LSI circuit 2.

The load signal LD is supplied to the register 21 through the terminal 104 of the first LSI circuit 1, the pattern wiring LL of the printed circuit board 3, and the terminal 204 of the second LSI circuit 2. When the load signal LD rises, the register 21 fetches the supplied data. The data "A" fetched by the register 21 is read and verified.

When the signal TEST1 rises from level LOW to level HIGH, the test data supplied to the switch 15 through the EOR gate 13 is inverted from A-5-A-5-A to 5-A-5-A-5. The inverted test data are fetched by the register 21 when the load signal LD rises. Namely the data "5" whose four bits are an inversion of the four bits of the previous data "A" is fetched by the register 21. The data "5" is then read out of the register 21 and verified.

In this way, connections between the terminals 105 to 10*n* and the terminals 205 to 20*n* are tested with both Levels HIGH and LOW. The hexadecimal numbers "5" and "A" are used as test data because the adjacent bits of each of these numbers have different levels. Accordingly, it will be possible to find a connection failure such as a short circuit between adjacent terminals.

Figure 3:
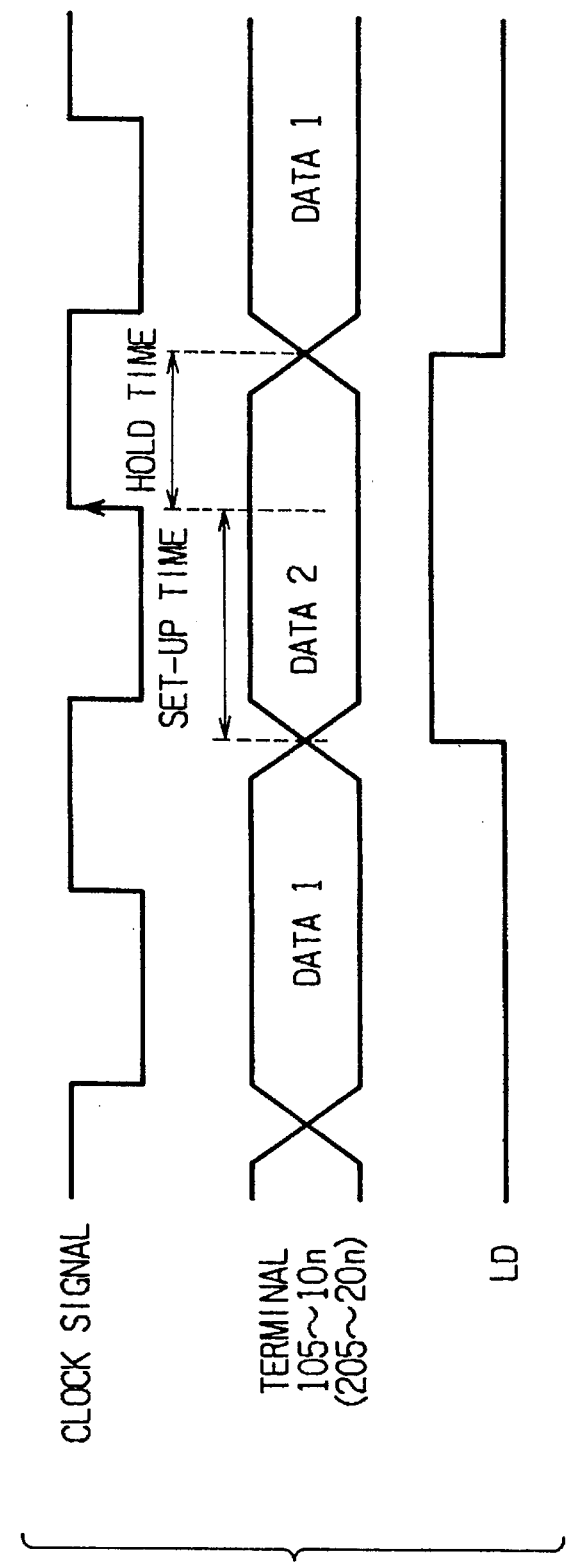
FIG. 3 is an enlarged view of a part of the timing chart of FIG. 2.

FIG. 3 is an enlarged view showing a part of the timing chart of FIG. 2. In FIG. 3, the test data changes from data 1 to data 2 and again back to data 1 around i.e., at the beginning and the end of a period in which the load signal LD changes to and from, respectively, level HIGH. This is because the circuit as a whole operates in synchronism with a clock signal, and the test data will not be provided at intervals exceeding clock cycles. Since the data 2 provided during the load period in which the load signal LD is at level HIGH is different from the data 1 that appears before and after the load period, the data is provided at the maximum intervals. This corresponds to verifying the dynamic operation (AC characteristics) of the circuit at the maximum possible speed. This means to test a set-up time and a hold time (both being the AC characteristics) that define temporal relationships between the clock signal and the data signal at the terminals 105 to 10n (205 to 20n).

Figure 4:
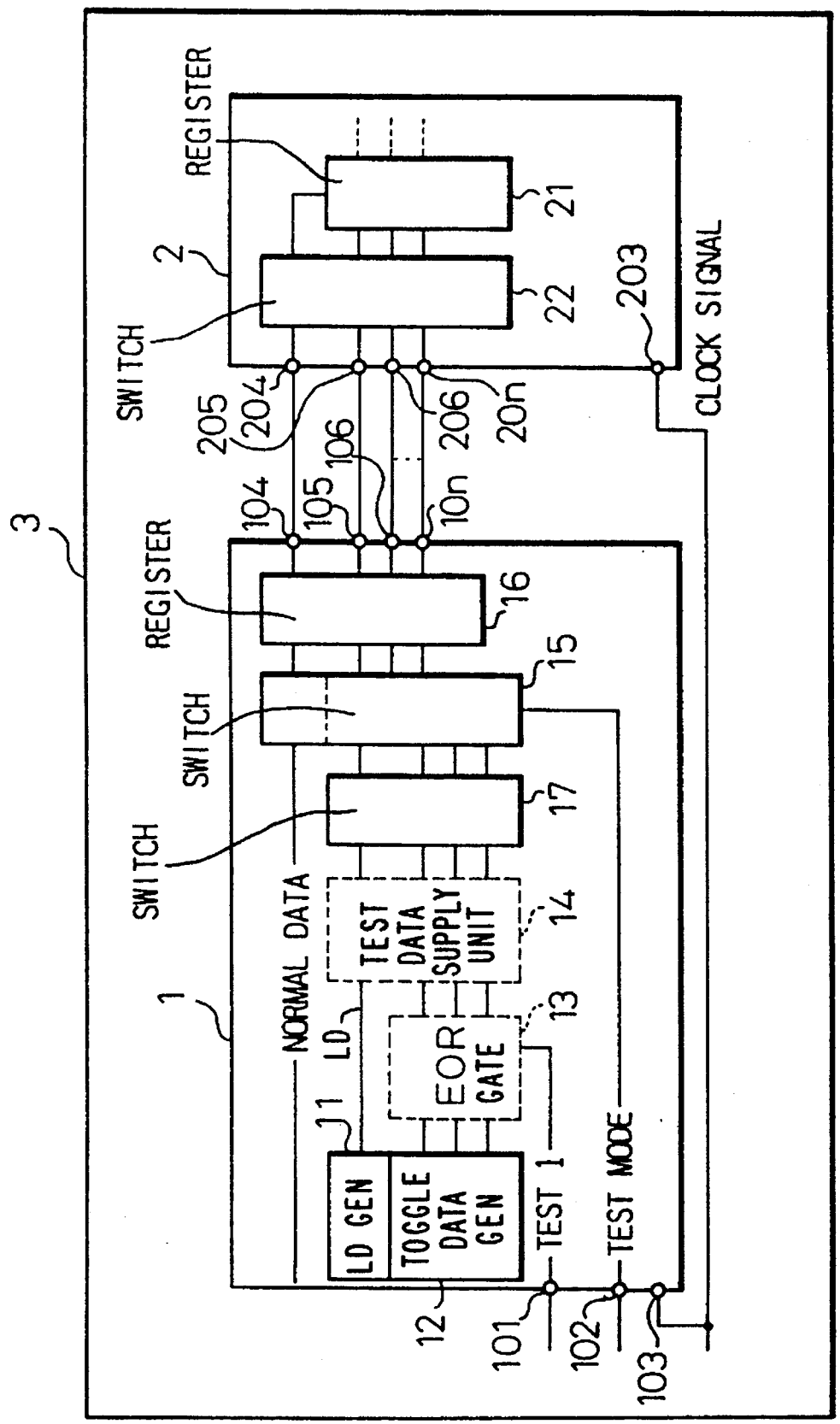
FIG. 4 shows testing of connections between terminals of semiconductor ICs according to a second embodiment of the present invention.

FIG. 4 shows an arrangement for implementing a method of testing connections between terminals of semiconductor ICs according to a second embodiment of the present invention.

The second embodiment arranges a switch 17, for a first LSI circuit 1, and a switch 22, for a second LSI circuit 2, so as to assign optional terminals for a load signal. This enables the load signal terminals 104 and 204 of the embodiment of FIG. 1 to be tested.

At first, terminals 104 and 204 of FIG. 4 are used as load signal terminals, and a connection test is carried out. Thereafter, the switches 17 and 22 are used to assign, for example, terminals 105 and 205 as the load signal terminals, and a connection test is carried out. As a result, the terminals 104 and 204 that have served as the load signal terminals in the beginning can also be tested.

Figure 5:
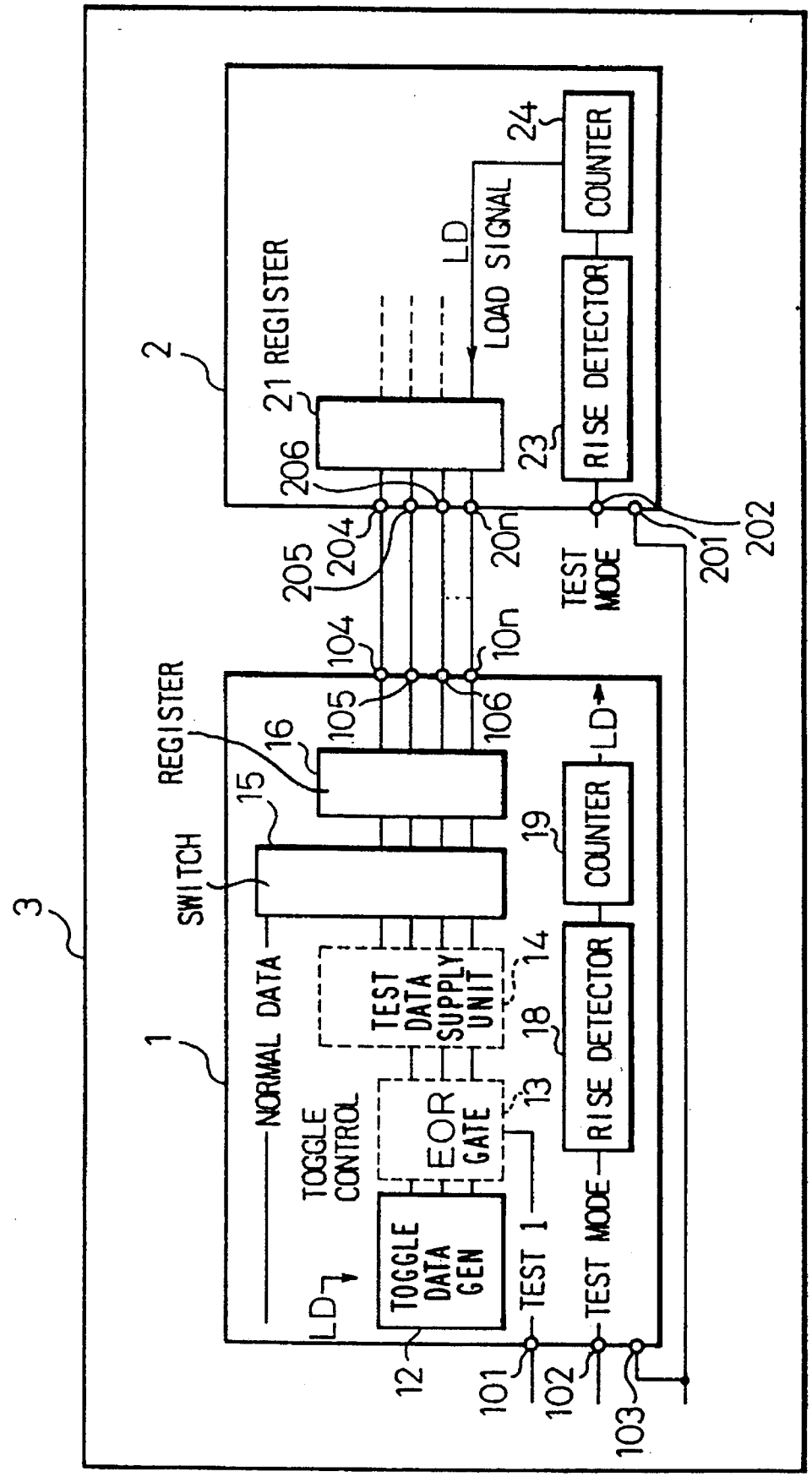
FIG. 5 shows testing of connections between terminals of semiconductor ICs according to a third embodiment of the present invention.

FIG. 5 shows an arrangement for implementing a method of testing connections of terminals of semiconductor ICs according to a third embodiment of the present invention. The third embodiment provides a first LSI circuit 1 with a rise detector 18 and a counter 19, and a second LSI circuit 2 with a rise detector 23 and a counter 24.

The rise detectors 18 and 23 detect a rise of a test mode signal. The counters 19 and 24 each provide a load signal LD a predetermined time after detecting the rise of the test mode signal. In the first LSI circuit 1, the load signal LD controls the toggle data generation 12, to provide predetermined test data in a predetermined period. In the second LSI circuit 2, the load signal LD, provided by the counter 24, determines the timing of a load signal receiving register 21 to fetch the test data. In this way, with no external load signal LD, the register 21 can fetch predetermined test data according to predetermined timing prepared from the test mode signal.

Figure 6:
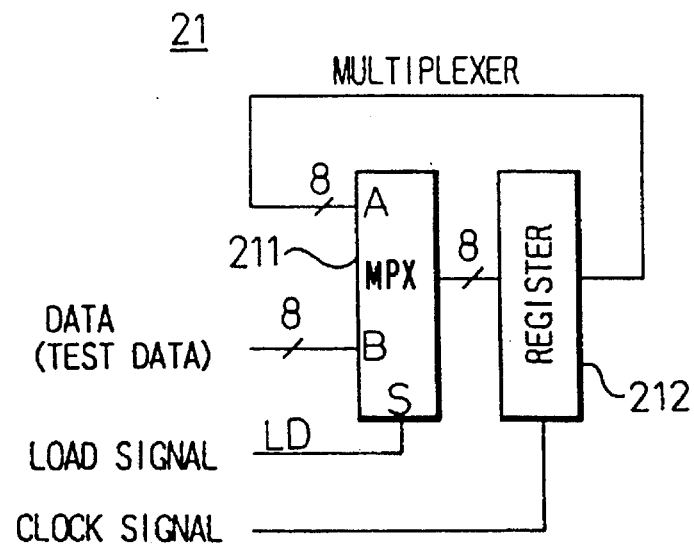
FIG. 6 is a block diagram showing an example of a load signal receiving register employed by the semiconductor IC according to the present invention.
Figure 7:
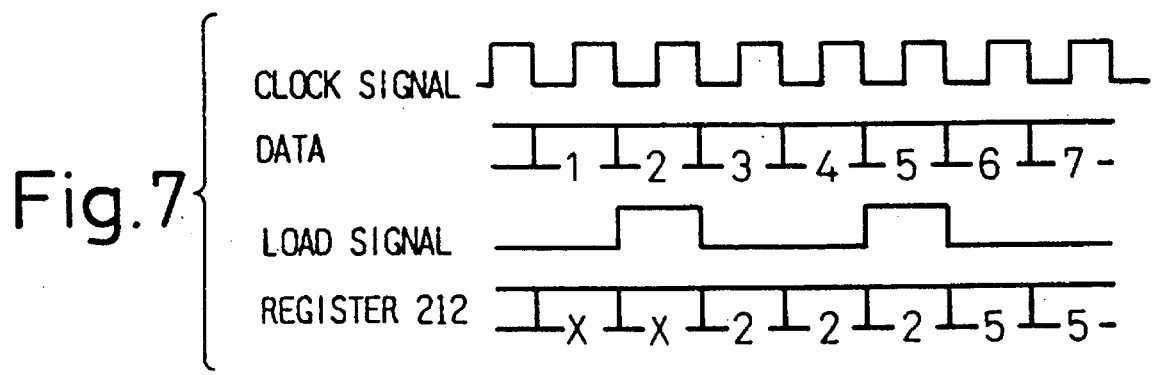
FIG. 7 is a timing chart explaining the operations of the register of FIG. 6.

FIG. 6 shows an example of the load signal receiving register 21 employed by the semiconductor IC according to the present invention. FIG. 7 is a timing chart explaining the operations of the register 21 of FIG. 6.

In FIG. 6, the register 21 provided for the second LSI circuit 2 has a multiplexer 211 and a register 212. In response to the load signal LD, the multiplexer 211 selects an output of the register 212, connected to an input terminal A of the multiplexer 211, or test data provided by the first LSI circuit 1 to an input terminal B of the multiplexer 211, and supplies the selected one to the register 212.

With reference to the waveforms of FIG. 7, the multiplexer 211 selects the output of the register 212, supplied to the input terminal A thereof, when the load signal LD falls to level LOW, and supplies the selected one to the register 212. Namely, the register 212 receives the previous data as it is, to thereby maintain the previous data. On the other hand, when the load signal LD rises to level HIGH, the multiplexer 211 selects the test data provided by the first LSI circuit 1 to the input terminal B, and supplies the selected one to the register 212. Accordingly, the register 212 is updated with the test data supplied to the input terminal B of the multiplexer 211. Namely, the data in the register 212 is updated (data "2" to data "5") whenever the load signal LD rises. In the other case, the register 212 holds the previous data.

FIG. 8 shows an example of a printed circuit board on which a plurality of semiconductor ICs are mounted. Connections between terminals of these ICs are tested according to the method of the present invention. In the figure, numeral 3 is the printed circuit board, 41 to 44 are the semiconductor ICs (LSI circuits) whose terminal connections are tested, 6 is a controlling microcomputer (microprocessor), and 7 is a personal computer.

In FIG. 8, the LSI circuits 41 to 44 are connected to an LSI control bus BS through which the controlling microcomputer 6 controls the LSI circuits 41 to 44 and collects status data therefrom. The LSI control bus BS is made of several data lines. Parallel data are converted into serial data and passed through the LSI control bus BS. If the parallel data is transferred as it is, a large number of data lines is required. This results in an increase in the number of pins of the LSI circuits 41 to 44. Converting the parallel data into serial data remarkably reduces the number of data lines required.

The controlling microcomputer 6 is connected to the external personal computer 7. An operator provides instructions, using a keyboard of the personal computer 7, to the controlling microcomputer 6, which then distributes the instructions to the LSI circuits 41 to 44. Similarly, the operator collects information from the LSI circuits 41 to 44 with use of the personal computer 7.

According to this example, an instruction to start testing connections between terminals of the LSI circuits on the printed circuit board 3 is provided from the personal computer 7 to the controlling microcomputer 6. The microcomputer 6 provides the instruction to the LSI circuits 41 to 44 through the LSI control bus BS. In response to the instruction, the LSI circuits 41 to 44 start a test mode to test the connections between the terminals of the LSI circuits.

An instruction to send test results is transferred to the LSI circuits through the personal computer 7, microcomputer 6, and LSI control bus BS. In response to this instruction, each of the LSI circuits provides a test result held in the register 21 to the personal computer 7 through the LSI control bus BS and microcomputer 6. Consequently, the test results from the LSI circuits 41 to 44 are displayed on a monitor of the personal computer 7.

The LSI circuits 41 to 44 have different addresses, so that instructions are individually sent to the LSI circuits through the LSI control bus BS. Each of the LSI circuits 41 to 44 responds only to an instruction addressed thereto. Accordingly, test results of the LSI circuits are respectively collectable.

As explained above, a method of testing connections between terminals of semiconductor ICs according to the present invention employs a first semiconductor IC having a test data generator for generating test data for the terminal connection test, a selector for selecting an output of the test data generator when carrying out the terminal connection test, and a test data output unit for providing the test data to an output connection. The method also employs a second semiconductor IC having a test data fetch-hold unit for fetching the test data from the first semiconductor IC and holding the same. The method verifies whether or not an output of the test data fetch-hold unit represents a predetermined value, to simplify testing of the terminal connections as well as AC characteristics.

Many different embodiments of the present invention may be constructed without departing from the spirit and scope of the present invention, and it should be understood that the present invention is not limited to the specific embodiments described in this specification, except as defined in the appended claims.

I claim:
1. A method of dynamically testing connections between terminals of a first semiconductor integrated circuit and terminals of a second semiconductor integrated circuit, each thereof performing realtime operations in transmission of test data between respective terminals of the first and second semiconductor integrated circuits in synchronism with a clock signal and wherein said first and second semiconductor integrated circuits are mounted on a printed circuit board and said first semiconductor integrated circuit comprises a test data generation circuit which generates test data outputs for said terminal connection test, the method comprising:

selecting test data outputs of said test data generation circuit of said first semiconductor integrated circuit during a terminal connection test, in synchronism with but independently of the clock signal, and providing the selected test data outputs to an output connection of said first semiconductor integrated circuit;

on said second semiconductor integrated circuit and in synchronism with but independently of the clock signal, fetching from the output connection of the first semiconductor integrated circuit, and holding, the selected test data outputs; and testing the terminal connections of said first and second semiconductor integrated circuits by verifying whether or not the test data which is fetched by and held in said second semiconductor integrated circuit represents a predetermined value.

2. A method as claimed in claim 1, further comprising:

in said first semiconductor integrated circuit, generating a real time load signal in synchronism with but independently of the clock signal when carrying out the terminal connection test in a normal operation real time speed; and in said second semiconductor integrated circuit, in response to receipt of the load signal from the first semiconductor integrated circuit, fetching the test data and storing the fetched test data in a register.

3. A method as claimed in claim 2, further comprising:

defining first and second successive clock pulses of the clock signal, said load signal being synchronized with the second clock pulse of the clock signal; and inverting the test data, to be fetched by said register, between the first clock pulse and the second clock pulse of said clock signal, thereby to test a set-up time of AC characteristics.

4. A method as claimed in claim 2, further comprising:

defining second and third clock pulses of the clock signal, said load signal being synchronized with the second clock pulse of the clock signal; and inverting the test data, to be fetched by said load signal receiving register, between the second clock pulse and the third clock pulse of said clock signal, thereby to test a hold time of AC characteristics.

5. A method as claimed in claim 2, wherein first and second pluralities of terminals are associated with the first and second semiconductor integrated circuits, said method further comprising:

assigning a terminal of the first plurality of terminals as a normally assigned load signal output terminal and assigning a terminal of the second plurality of terminals as a normally assigned load signal receiving terminal; and, for a terminal connection test, alternatively assigning a different terminal of said first plurality of terminals of said first semiconductor integrated circuit as an alternative load signal providing terminal and a different terminal of said second plurality of terminals of said second semiconductor integrated circuit as an alternative load signal receiving terminal, thereby to enable testing of the connection between said normally assigned load signal providing and receiving terminals.

6. A method as claimed in claim 1, further comprising, in said first and second semiconductor integrated circuits:

generating corresponding first and second load signals in response to respective and corresponding, first and second test mode signals and respectively synchronized with first and second clock pulses of the clock signal; and responding to the respective load signals generated therein for fetching the selected test data output by the other of the first and second integrated circuits.

7. A method as claimed in claim 6, further comprising:

in each of said first and second semiconductor integrated circuits, detecting a rise of said respective one of said first and second test mode signals and generating said respective load signal a predetermined time after the detected rise of said respective test mode signal.

8. An apparatus for testing connections between a first plurality of terminals of a first semiconductor integrated circuit and a second plurality of terminals of a second semiconductor integrated circuit, said first and second semiconductor integrated circuits being mounted on a common printed circuit board and the first and second pluralities of terminals being connected together by corresponding conductor lines, wherein, in a normal, realtime operation, normal data is output by the first semiconductor integrated circuit at the first plurality of terminals and transmitted over the corresponding conductor lines to the second plurality of terminals for being received at the second semiconductor integrated circuit in synchronism with a clock signal, said apparatus comprising:

in said first semiconductor integrated circuit, test data generation means for generating test data and producing test data outputs, selection means for normally supplying the normal data to the first plurality of terminals and selectively operable in a test mode for selecting outputs of said test data generation means during a terminal connection test, and data output means, connected intermediate the selection means and the first plurality of terminals, for receiving the selected one of the test data and the normal data, as selected by the selection means, and outputting same to the first plurality of terminals for transmission over the corresponding conductor lines to the second plurality of terminals of the second semiconductor integrated circuit in synchronism with the clock signal;

in said second semiconductor integrated circuit, test data fetch-hold means connected to the second plurality of terminals for fetching, in synchronism with but independently of the clock signal, and holding the data transmitted over the conductor lines from said first semiconductor integrated circuit and presented at the second plurality of terminals; and means operative in a test mode in realtime for controlling said selection means to select outputs of said test data generation means, said data output means correspondingly providing the selected test data to the first plurality of terminals and through the corresponding conductor lines to the second plurality of terminals and the fetch-hold means correspondingly fetching, in synchronism with but independently of the clock signal, and holding the test data as thus transmitted to the second plurality of terminals, the terminal connections of said first and second semiconductor integrated circuits being tested by verifying whether or not an output of said test data fetch-hold means represents a predetermined value.

9. An apparatus as claimed in claim 8, wherein:

said first semiconductor integrated circuit further comprises load signal output means for providing a real time load signal in synchronism with but independently of the clock signal when carrying out the terminal connection test in a normal operation real time speed; and said test data fetch-hold means of said second semiconductor integrated circuit comprises a register that fetches the test data and stores the fetched test data in response to said load signal.

10. An apparatus as claimed in claim 9, wherein, relative to first and second clock pulses of the clock signal, said load signal output means outputs said load signal in synchronism with the second clock pulse of the clock signal, and the test data to be fetched by said register is inverted between the first clock pulse and the second clock pulse of said clock signal, to test a set-up time of AC characteristics.

11. An apparatus as claimed in claim 9, wherein, relative to second and third clock pulses of the clock signal, said load signal output means outputs said load signal in synchronism with the second clock pulse of the clock signal, and the test data to be fetched by said register is inverted between the second clock pulse and the third clock pulse of said clock signal, to test a hold time of AC characteristics.

12. An apparatus as claimed in claim 9, wherein the first and second pluralities of terminals respectively include a normally assigned load signal output terminal and a normally assigned load signal receiving terminal, said apparatus further comprising:

means for selectively assigning an alternative terminal, different from the normally assigned load signal output terminal of said first plurality of terminals of said first semiconductor integrated circuit, as an alternative load signal output terminal, and an alternative terminal, of the second plurality of terminals of said second semiconductor integrated circuit, as an alternative load signal receiving terminal, and for transmitting the load signal over the corresponding conductor line between the alternative load signal output and receiving terminals thereby to enable testing the connection between said normally assigned load signal output and receiving terminals.

13. An apparatus as claimed in claim 8, wherein:

said first and second semiconductor integrated circuits further comprise respective, first and second load signal generation means, each for generating a corresponding load signal in response to a test mode signal and in synchronism with the clock signal; and said test data fetch-hold means of said second semiconductor integrated circuit comprises a register that fetches the test data in response to said load signal.

14. An apparatus as claimed in claim 13, wherein each of said respective load signal generation means of said first and second semiconductor integrated circuits further comprises:

a rise detector for detecting a rise of said test mode signal; and a counter for generating and outputting said corresponding load signal thereof a predetermined time after the rise detector detects the rise of said test mode signal and in synchronism with the clock signal.

* * * * *